US009653508B2

(12) United States Patent
Lin et al.

(10) Patent No.: US 9,653,508 B2
(45) Date of Patent: May 16, 2017

(54) PAD STRUCTURE EXPOSED IN AN OPENING THROUGH MULTIPLE DIELECTRIC LAYERS IN BSI IMAGE SENSOR CHIPS

(71) Applicant: Taiwan Semiconductor Manufacturing Company, Ltd., Hsin-Chu (TW)

(72) Inventors: Jeng-Shyan Lin, Tainan (TW); Dun-Nian Yaung, Taipei (TW); Jen-Cheng Liu, Hsin-Chu (TW); Wen-De Wang, Minsyong Township (TW); Shuang-Ji Tsai, Tainan (TW); Yueh-Chiou Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/155,961

(22) Filed: May 16, 2016

(65) Prior Publication Data
US 2016/0260764 A1 Sep. 8, 2016

Related U.S. Application Data

(63) Continuation of application No. 14/691,243, filed on Apr. 20, 2015, now Pat. No. 9,362,329, which is a (Continued)

(51) Int. Cl.
*H01L 27/00* (2006.01)
*H01L 27/146* (2006.01)
(Continued)

(52) U.S. Cl.
CPC .. *H01L 27/14636* (2013.01); *H01L 21/76898* (2013.01); *H01L 23/481* (2013.01);
(Continued)

(58) Field of Classification Search
CPC ......... H01L 27/14636; H01L 21/76898; H01L 23/481; H01L 24/03; H01L 24/05;
(Continued)

(56) References Cited

U.S. PATENT DOCUMENTS 6,369,417 B1 4/2002 Lee
7,582,502 B1 9/2009 Hwang et al.
(Continued)

FOREIGN PATENT DOCUMENTS

JP 2005210060 A 8/2005
JP 2009176777 A 8/2009
(Continued)

*Primary Examiner* — Kimberly Rizkallah
*Assistant Examiner* — Alexander Belousov
(74) *Attorney, Agent, or Firm* — Slater Matsil, LLP

(57) ABSTRACT

An integrated circuit structure includes a semiconductor substrate, and a dielectric pad extending from a bottom surface of the semiconductor substrate up into the semiconductor substrate. A low-k dielectric layer is disposed underlying the semiconductor substrate. A first non-low-k dielectric layer is underlying the low-k dielectric layer. A metal pad is underlying the first non-low-k dielectric layer. A second non-low-k dielectric layer is underlying the metal pad. An opening extends from a top surface of the semiconductor substrate down to penetrate through the semiconductor substrate, the dielectric pad, and the low-k dielectric layer, wherein the opening lands on a top surface of the metal pad. A passivation layer includes a portion on a sidewall of the opening, wherein a portion of the passivation layer at a bottom of the opening is removed.

20 Claims, 6 Drawing Sheets

Related U.S. Application Data continuation of application No. 13/198,111, filed on Aug. 4, 2011, now Pat. No. 9,013,022.

(51) Int. Cl.
*H01L 23/48* (2006.01)
*H01L 21/768* (2006.01)
*H01L 23/00* (2006.01)
H01L 23/525 (2006.01)

(52) U.S. Cl.
CPC .............. *H01L 24/03* (2013.01); *H01L 24/05* (2013.01); *H01L 24/11* (2013.01); *H01L 24/48* (2013.01); *H01L 24/83* (2013.01); *H01L 27/1463* (2013.01); *H01L 27/1464* (2013.01); *H01L 27/14623* (2013.01); *H01L 27/14643* (2013.01); *H01L 27/14683* (2013.01); *H01L 27/14685* (2013.01); *H01L 27/14689* (2013.01); *H01L 23/525* (2013.01); *H01L 24/45* (2013.01); *H01L 2224/02166* (2013.01); *H01L 2224/04042* (2013.01); *H01L 2224/0557* (2013.01); *H01L 2224/05571* (2013.01); *H01L 2224/05572* (2013.01); *H01L 2224/05624* (2013.01); *H01L 2224/1134* (2013.01); *H01L 2224/11916* (2013.01); *H01L 2224/451* (2013.01); *H01L 2224/45124* (2013.01); *H01L 2224/45144* (2013.01); *H01L 2224/48453* (2013.01); *H01L 2224/48463* (2013.01); *H01L 2224/83359* (2013.01); *H01L 2924/00014* (2013.01); *H01L 2924/01013* (2013.01); *H01L 2924/10253* (2013.01); *H01L 2924/13091* (2013.01); *H01L 2924/3025* (2013.01)

(58) Field of Classification Search
CPC ......... H01L 24/11; H01L 24/48; H01L 24/83; H01L 27/14623; H01L 27/1463; H01L 27/1464; H01L 27/14683; H01L 27/14685; H01L 27/14689; H01L 23/525; H01L 24/45; H01L 2224/02166; H01L 2224/04042; H01L 2224/0557; H01L 2224/05571

See application file for complete search history.

(56) References Cited

U.S. PATENT DOCUMENTS

| | | | |
|---|---|---|---|
| 7,659,595 | B2 | 2/2010 | Shiau et al. |
| 2005/0142715 | A1 | 6/2005 | Sakoda et al. |
| 2009/0020842 | A1 | 1/2009 | Shiau et al. |
| 2009/0146148 | A1 | 6/2009 | Pyo |
| 2009/0185060 | A1 | 7/2009 | Akiyama |
| 2009/0251573 | A1 | 10/2009 | Toyoda |
| 2009/0280596 | A1 | 11/2009 | Akiyama |
| 2010/0109006 | A1 | 5/2010 | Kobayashi et al. |
| 2013/0032916 | A1 | 2/2013 | Lin et al. |

FOREIGN PATENT DOCUMENTS

| | | |
|---|---|---|
| JP | 2009252949 A | 10/2009 |
| JP | 2011003645 | 1/2011 |
| KR | 20100048890 A | 5/2010 |

PAD STRUCTURE EXPOSED IN AN OPENING THROUGH MULTIPLE DIELECTRIC LAYERS IN BSI IMAGE SENSOR CHIPS

PRIORITY CLAIM AND CROSS-REFERENCE

This application is a continuation of U.S. patent application Ser. No. 14/691,243, entitled "Pad Structure Exposed in an Opening Through Multiple Dielectric Layers in BSI Image Sensor Chips," filed Apr. 20, 2015, which is a continuation of U.S. patent application Ser. No. 13/198,111, filed Aug. 4, 2011, (now U.S. Pat. No. 9,013,022, issued on Apr. 21, 2015), the entire contents of all of which are hereby incorporated by reference.

BACKGROUND

Backside illumination (BSI) image sensor chips are replacing front side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon chip. The interconnect structure includes a plurality of metal layers including bottom metal layer M1 through top metal layer Mtop.

The wafer is then flipped over. A backside grinding is performed on the silicon substrate from the backside of the silicon substrate. A buffer oxide layer may be formed over the back surface of the remaining silicon substrate, and a first opening is formed to extend from the buffer oxide layer to stop at a shallow-trench isolation (STI) pad that is formed in the silicon substrate. A second opening is then formed inside the first opening to further etch the STI pad and the interlayer dielectric (ILD) that is directly under the etched portion of the STI pad, so that a metal pad in the bottom metal layer M1 is exposed. The second opening is smaller than the first opening. An aluminum copper pad is then formed in the first and the second openings and electrically coupled to the metal pad in metal layer M1. The aluminum copper pad may be used for bonding to the BSI chip.

It was found that conventional bond structures may suffer from film peeling during ball shearing tests. The metal pad in the bottom metal layer M1, which metal pad is bonded to the aluminum copper pad, may delaminate from the underlying etch stop layer. The peeling may be caused by the inferior adhesion between the metal pad and the etch stop layer, which is typically formed of silicon carbide.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A pad structure for backside illumination (BSI) image sensor devices and the method of forming the same are provided in accordance with various embodiments. The intermediate stages of forming BSI pad structures are illustrated. The variations of the embodiments are discussed. Throughout the various views and illustrative embodiments, like reference numbers are used to designate like elements.

Figure 1:
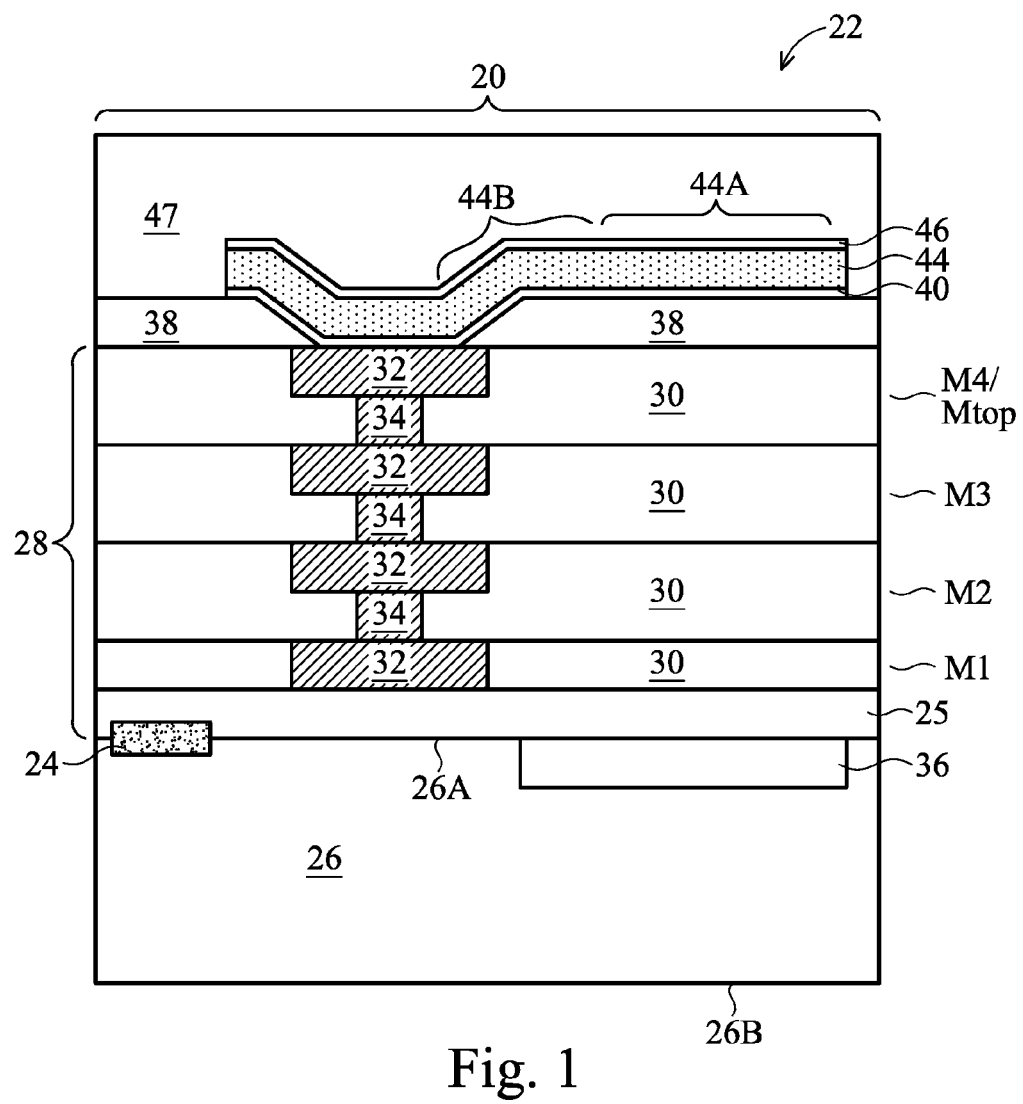
FIGS. 1 through 6 are cross-sectional views of intermediate stages in the manufacturing of bond pad structures in a backside illumination image sensor wafer in accordance with various embodiments.

FIGS. 1 through 6 illustrate the cross-sectional views of intermediate stages in the manufacturing of pad structures in accordance with some embodiments. FIG. 1 illustrates image sensor chip 20, which may be part of wafer 22. Image sensor chip 20 includes semiconductor substrate 26, which may be a crystalline silicon substrate or a semiconductor substrate formed of other semiconductor materials. Throughout the description, surface 26A is referred to a front surface of semiconductor substrate 26, and surface 26B is referred to as a backside of semiconductor substrate 26. Image sensor 24, which may be a photo-sensitive MOS transistor or a photo-sensitive diode, is formed at the surface of semiconductor substrate 26. Accordingly, wafer 22 may be an image sensor wafer. Throughout the description, the side that image sensor 24 is on is referred to the front side, and the opposite side is referred to as a backside, of semiconductor substrate 26. Dielectric pad 36, which may be a shallow-trench isolation (STI) pad, extends from a top surface (which is front surface 26A) of semiconductor substrate 26 into semiconductor substrate 26.

Interconnect structure 28 is formed over semiconductor substrate 26, and is used to electrically interconnect the devices in image sensor chip 20. Interconnect structure 28 includes interlayer dielectric (ILD) 25 formed over semiconductor substrate 26, wherein contact plugs (not shown) may be formed in ILD 25. The metal layers include metal lines/pads 32 and vias 34 in dielectric layers 30. Image sensor 24 may be electrically coupled to metal pads/lines 32 and vias 34 in metal layers M1 through Mtop.

The metal layers are marked as M1, M2 . . . and Mtop, wherein metal layer M1 is the bottom metal layer of interconnect structure 28, and metal layer Mtop is the top metal layer of interconnect structure 28. In the illustrated embodiments, there are four metal layers, and metal layer Mtop is M4. However, wafer 22 may include more or fewer metal layers. In an embodiment, dielectric layers 30, in which metal lines 32 and vias 34 of metal layers M1 through Mtop are formed, are low-k dielectric layers having low k values, for example, lower than about 3.0, or lower than about 2.5.

Dielectric layer 38 is formed over top metal layer Mtop. Dielectric layer 38 may be formed of a non-low-k dielectric material having a k value greater than 3.9. In an embodiment, dielectric layer 38 is formed of an oxide such as un-doped silicate glass (USG), boron-doped silicate glass (BSG), phosphorous-doped silicate glass (BSG), boron-doped phospho-silicate glass (BPSG), or the like. Dielectric layer 38 may also be formed of a silicon oxide layer and a silicon nitride layer on the silicon oxide layer.

Glue layer 40 is formed over dielectric layer 38, and extends into an opening in dielectric layer 38 to electrically couple to metal line 32, which is in metal layer Mtop. In an embodiment, glue layer 40 is formed of tantalum, tantalum nitride, titanium, titanium nitride, or the like. Over glue layer 40 are formed of metallic feature 44, which include metal pad 44A and metal line 44B. Metallic feature 44 may comprise aluminum, aluminum copper, or the like. Glue layer 40 may be between and contacting dielectric layer 38 and metallic feature 44. Glue layer 46 may also be formed over metallic feature 44, wherein glue layer 46 may be formed of tantalum, tantalum nitride, titanium, titanium nitride, or the like. The formation of glue layers 40 and 46 and metal features 44 may include forming a first glue layer, forming a metal layer over the first glue layer, forming a second glue layer over the metal layer, and patterning the first glue layer, the metal layer, and the second glue layer using a same mask. Accordingly, glue layers 40 and 46 and metal feature 44 may be co-terminus, with their respective edges vertically aligned to each other.

Passivation layer 47 is formed over glue layer 46 and dielectric layer 38. Similar to dielectric layer 38, passivation layer 47 may be formed of a non-low-k dielectric material having a k value greater than 3.9. In an embodiment, passivation layer 47 is formed of an oxide such as USG, BSG, BPSG, or the like. Passivation layer 47 may also be formed of a silicon oxide layer and a silicon nitride layer on the silicon oxide layer, for example. Passivation layer 47 fully encapsulate glue layers 40 and 46 and metal feature 44.

Figure 2:
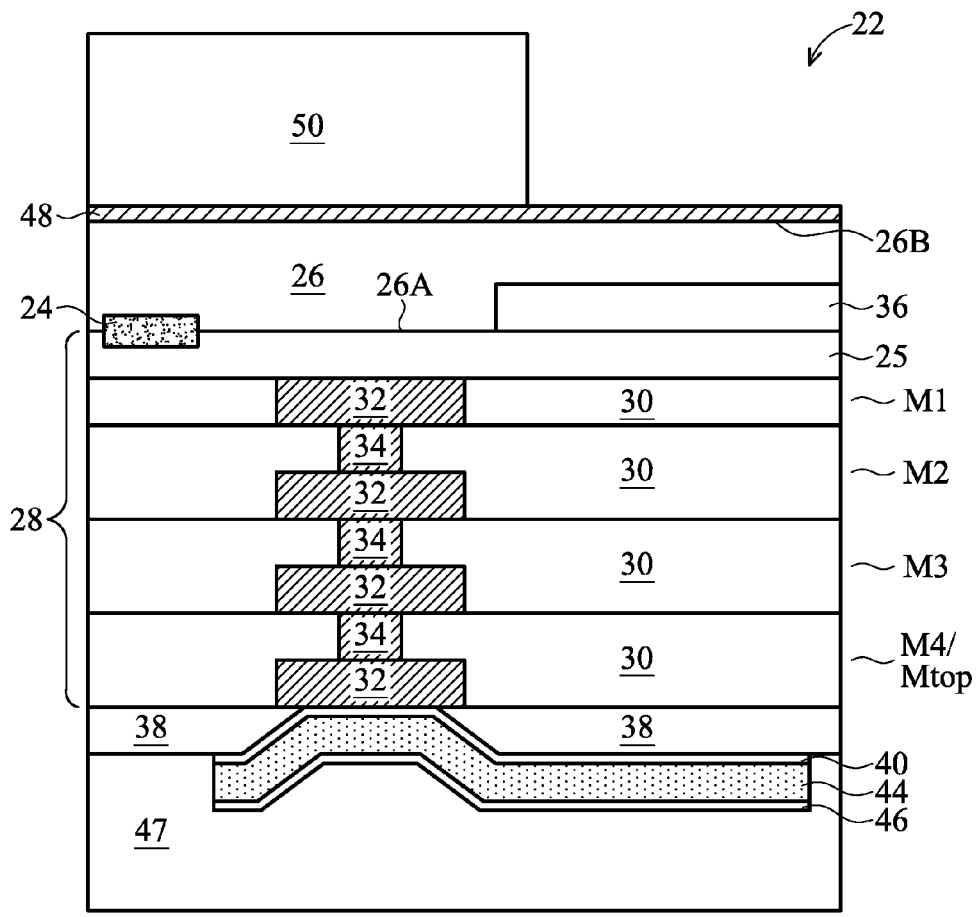

Referring to FIG. 2, wafer 22 is flipped over, and is attached to a carrier (not shown) that is under wafer 22. Accordingly, the top surfaces of each of the features shown in FIG. 1 become bottom surfaces, and vice versa. Semiconductor substrate 26 faces up in FIG. 2. A backside grinding is performed to thin semiconductor substrate 26, until the thickness of wafer 22 is smaller than about 20 μm, or smaller than about 10 μm, for example. The back surface 26B of the resulting semiconductor substrate 26 is marked. At this thickness, light can penetrate from the backside (which is opposite the front side) of semiconductor substrate 26 through the remaining semiconductor substrate 26, and reach image sensor 24. After the thinning, buffer oxide layer 48 may be formed on the backside surface of semiconductor substrate 26. In an embodiment, buffer oxide layer 48 includes a silicon oxide layer, a bottom anti-reflective coating (BARC) layer over the silicon oxide layer, and another oxide layer over the BARC layer, although buffer layer 48 may have different structures and formed of different materials. Mask 50, which may be a photo resist, is formed over wafer 22 and then patterned.

Figure 3:
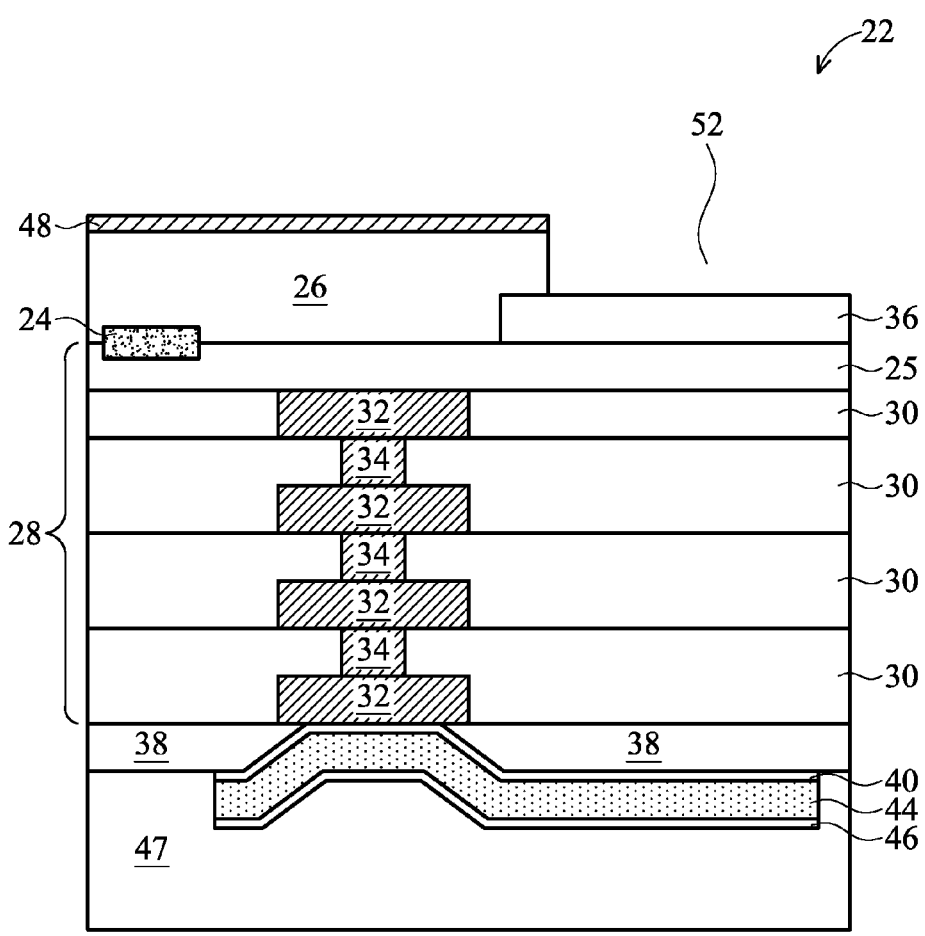

Referring to FIG. 3, buffer oxide layer 48 and semiconductor substrate 26 are etched to form opening 52. Mask 50 is then removed. In the etch step, STI pad 36 is used as an etch stop layer, and the etch stops on STI pad 36. The top surface of STI pad 36 is thus exposed by opening 52.

Figure 4:
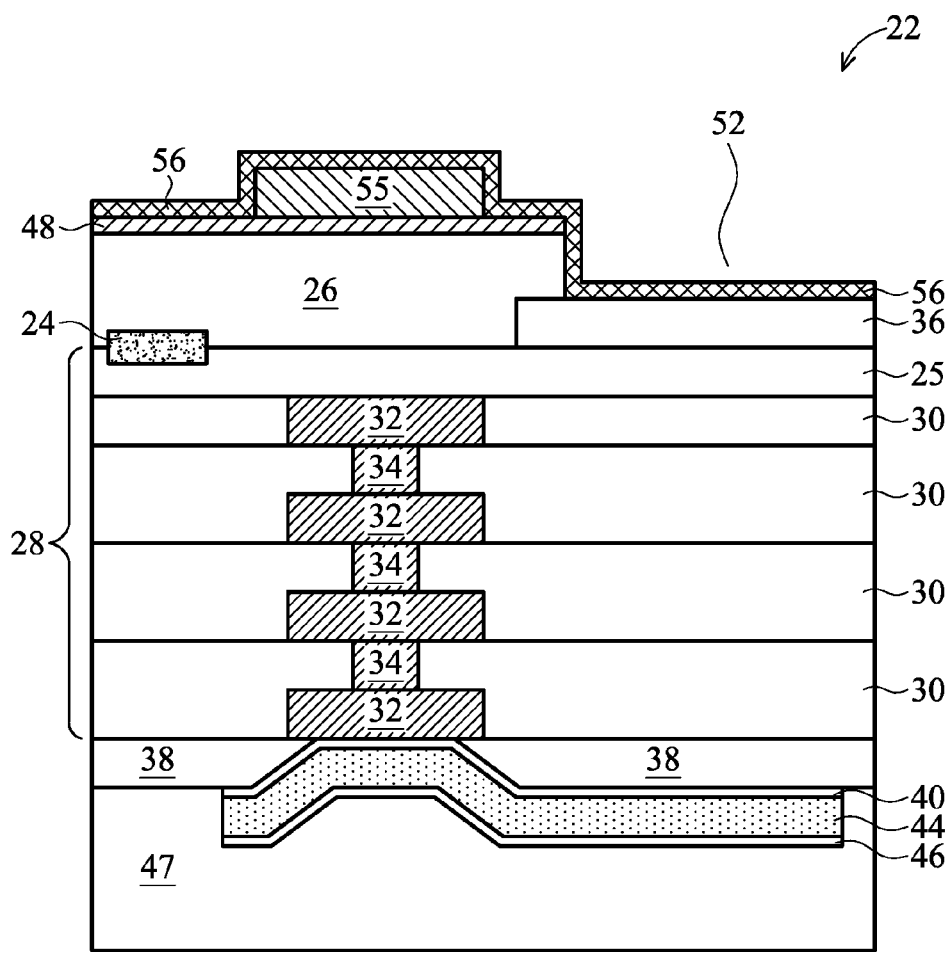

FIG. 4 illustrates the formation of metal shield 55 and buffer oxide layer 56. In an embodiment, the formation of metal shield 55 includes forming a metal layer, and then patterning the metal layer to leave metal shield 55 over portions of semiconductor substrate 26, so that metal shield 55 may block the light from reaching the portions of devices (such as transistors, not shown) that are directly under metal shield 55. Metal shield 55 may comprise aluminum and/or copper. After the formation of metal shield 55, buffer oxide layer 56 is formed. Buffer oxide layer 56 may be formed of a similar material as that of buffer oxide layer 48. Buffer oxide layer 56 comprises a first portion directly over semiconductor substrate 26, and a second portion extending into opening 52. The second portion further includes a portion on the sidewall of semiconductor substrate 26, and a portion directly over STI pad 36.

Figure 5:
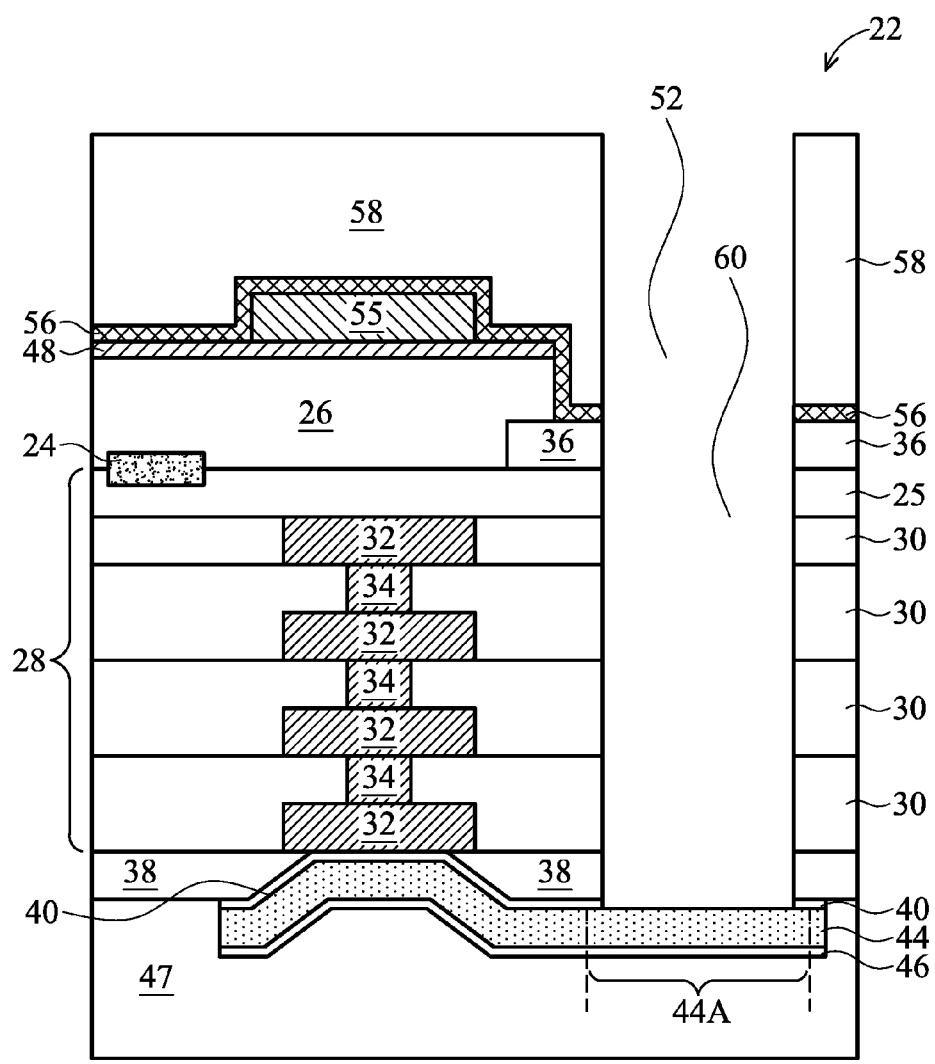

Next, as shown in FIG. 5, photo resist 58 is formed and patterned, and STI pad 36 is etched using photo resist 58 as a mask. Accordingly, opening 60 is formed. It is noted that the for illustrating the details in metal layers, the aspect ratio of the illustrated opening 60 is much greater than the aspect ratio of the actual opening that is formed on physical wafers. The actual opening may have horizontal dimensions that are significantly greater than, sometimes tens of times as, the height of opening 60. During the etching step, low-k dielectric layers 30 and non-low-k dielectric layer 38 are also etched, and the etch stops on metal pad 44A. The portion of glue layer 40 that is exposed to opening 60 may be removed during the etching step. As a result, metal pad 44A is exposed to opening 60. Photo resist 58 is then removed. In the resulting structure, openings 52 and 60 form a continuous opening.

Figure 6:
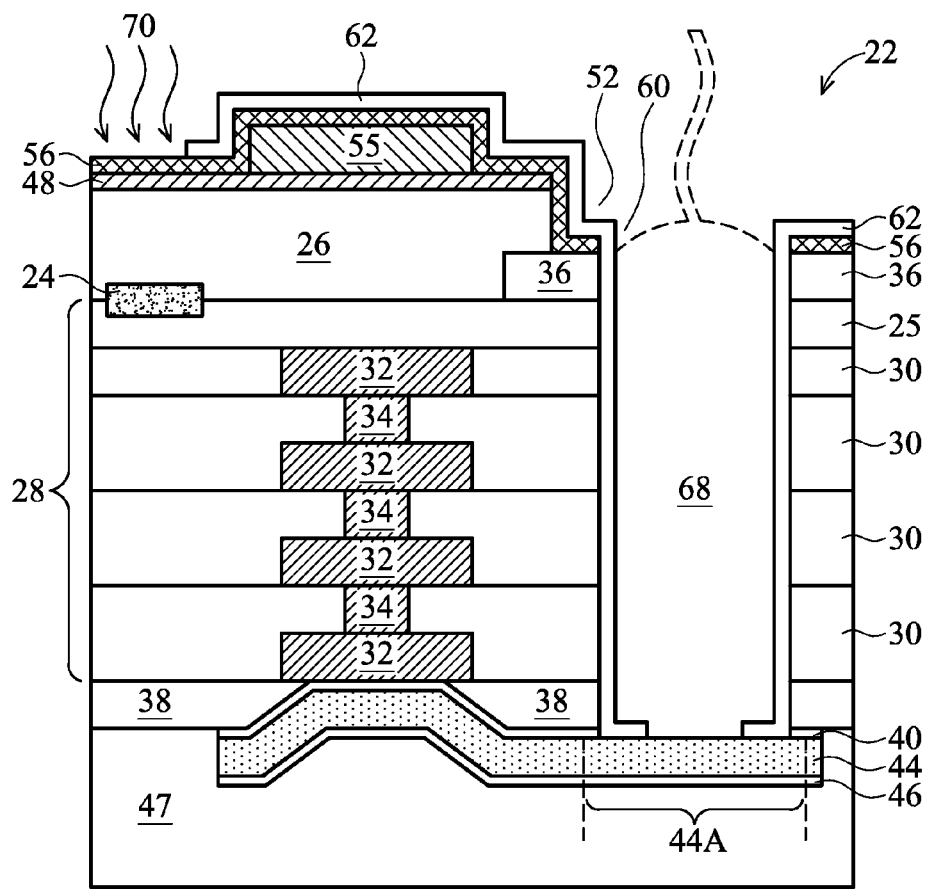

FIG. 6 illustrates the formation of passivation layer 62, which may be formed of an oxide layer (such as a silicon oxide layer) and a nitride layer (such as a silicon nitride layer) over the oxide layer. Passivation layer 62 extends on the top surface of buffer oxide layer 56, and extends into openings 52 and 60. Passivation layer 62 comprises portions on the sidewalls of opening 60, so that low-k dielectric layers 30 are protected from the moisture. A patterning step is performed, so that the portion of passivation layer 62 at the bottom of opening 60 is removed, and metal pad 44A is exposed. In addition, passivation layer 62 may be removed from directly over image sensor 24. Accordingly, light (symbolized with curved arrows 70) may penetrate through the buffer oxide layers 48/56 and semiconductor substrate 26 to reach image sensor 24, which converts the light to electrical signals.

In an embodiment, a wire bonding is performed to form wire bond bump 68, which is bonded to metal pad 44A. Wire bond bump 68 may comprise gold, aluminum, or the like. The wire bonding may be performed after wafer 22 is sawed apart into image sensor chips. In the resulting structure, wire bond bump 68 may be in physical contact with metal pad 44A.

In the embodiments, wire bond bump 68 is bonded to metal pad 44A, which is further located on glue layer 46. Glue layer 46 has good adhesion to both passivation layer 47 and metal pad 44A. Accordingly, the bonding has a better mechanical strength than the conventional bonding. In the conventional bonding, wire bond bumps are formed on the metal features in bottom metal layer M1, which metal features may delaminated from the underlying etch stop layer due to the inferior adhesion, and also due to the weakness of the low-k dielectric materials.

In accordance with embodiments, an integrated circuit structure includes a semiconductor substrate, and a dielectric pad extending from a bottom surface of the semiconductor substrate up into the semiconductor substrate. A low-k dielectric layer is disposed underlying the semiconductor substrate. A first non-low-k dielectric layer is underlying the low-k dielectric layer. A metal pad is underlying the first non-low-k dielectric layer. A second non-low-k dielectric layer is underlying the metal pad. An opening extends from a top surface of the semiconductor substrate down to penetrate through the semiconductor substrate, the dielectric pad, and the low-k dielectric layer, wherein the opening lands on a top surface of the metal pad. A passivation layer includes a portion on a sidewall of the opening, wherein a portion of the passivation layer at a bottom of the opening is removed.

In accordance with other embodiments, an integrated circuit structure includes a semiconductor substrate. An STI pad extends from a bottom surface of the semiconductor substrate into the semiconductor substrate. An image sensor is disposed at the bottom surface of the semiconductor substrate. A plurality of low-k dielectric layers is underlying the semiconductor substrate. A first non-low-k dielectric layer is underlying the low-k dielectric layers. A metal pad is underlying the first non-low-k dielectric layer. A first opening extends from a top surface of the semiconductor substrate to a top surface of the STI pad. A second opening extends from the top surface of the STI pad to a top surface of the metal pad, wherein the first and the second openings are connected to form a continuous opening. A passivation layer is formed to have a first portion directly over the semiconductor substrate, and a second portion on a sidewall of the first opening and a sidewall of the second opening. The passivation layer has an opening at a bottom of the second opening.

In accordance with yet other embodiments, a method includes etching a semiconductor substrate from a backside of the semiconductor substrate to form a first opening. The first opening stops at a top surface of an STI pad in the semiconductor substrate. The STI pad, a low-k dielectric layer underlying the STI pad, and a non-low-k dielectric layer underlying the low-k dielectric layer are then etched to form a second opening, wherein a top surface of a metal pad underlying the non-low-k dielectric layer is exposed through the second opening. The first and the second openings form a continuous opening. A passivation layer is formed over the semiconductor substrate, wherein the passivation layer extends on sidewalls and a bottom of the first opening and a bottom the second openings. A bottom portion of the passivation layer is removed from the bottom of the second opening to expose the metal pad, wherein sidewall portions of the passivation layer are not removed.

According to an embodiment, a method includes forming a plurality of dielectric layers on a front side of a substrate, forming a metal pad on the plurality of dielectric layers, and forming a metal shield on a backside of the substrate. The methods further includes forming an opening from the backside of the substrate, the opening penetrating through the substrate and the plurality of dielectric layers, the opening exposing a surface of the metal pad, and forming a passivation layer on a sidewall and a bottom of the opening, the passivation layer at the bottom of the opening partially covering the exposed surface of the metal pad, the passivation layer extending over the metal shield.

According to another embodiment, a method includes forming a shallow-trench isolation (STI) pad on a front side of a substrate, forming a photosensitive device on the front side of the substrate, and forming a plurality of dielectric layers over the photosensitive device and the STI pad on the front side of the substrate. The method further includes forming a metal pad over the plurality of dielectric layers on the front side of the substrate, and etching the substrate from a backside of the substrate to form a first portion of an opening, the first portion of the opening exposing the STI pad. The method further includes forming a buffer layer over the backside of the substrate and on a sidewall and a bottom of the first portion of the opening, and etching the buffer layer, the STI pad, and the plurality of dielectric layers to form a second portion of the opening, the second portion of the opening exposing a portion of the metal pad.

According to yet another embodiment, a method includes forming a photosensitive device on a front side of a substrate. An interconnect structure is formed on the front side of the substrate, interconnect structure being disposed over the photosensitive device. A glue layer is formed over the interconnect structure, the glue layer contacting at least one conductive feature of the interconnect structure. A metal pad is formed on the glue layer. A metal shield is formed on a backside of the substrate. A first etch process is performed from the backside of the substrate to form an opening, the opening partially extending through the substrate. A second etch process is performed from the backside of the substrate to extend the opening through dielectric layers of the interconnect structure and the glue layer, the extended opening exposing a first portion of the metal pad. A passivation layer is formed on the backside of the substrate and on a sidewall and a bottom of the extended opening, the passivation layer extending to cover a top surface of the metal shield. The passivation layer is patterned at the bottom of the extended opening to expose a second portion of the metal pad. A bump is formed in the extended opening to electrically connect the metal pad, the passivation layer adjoining the bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate comprising a front side and a backside;
    a shallow-trench isolation (STI) region extending from a front side of the substrate into the substrate;
    a metal shield on the backside of the substrate;
    a plurality of dielectric layers on the front side of the substrate and on the STI region;
    a metal pad on the plurality of dielectric layers;
    an opening extending from the backside of the substrate to penetrate through the substrate, the STI region, and the plurality of dielectric layers, the opening exposing a portion of the metal pad;
    a passivation layer lining the opening and extending partially along the metal pad, the passivation layer directly adjoining each of the plurality of dielectric layers, the passivation layer extending to cover a top surface of the metal shield; and
    a bump formed in the opening and electrically connected to the metal pad, the bump directly adjoining the passivation layer.

2. The device of claim 1, wherein the metal pad comprises aluminum.

3. The device of claim 1 further comprising:
    a glue layer between the metal pad and the plurality of dielectric layers, the opening extending through the glue layer.

4. The device of claim 3, wherein sidewalls of the plurality of dielectric layers and the glue layer are aligned, the sidewalls adjoining a sidewall of the passivation layer.

5. The device of claim 1, wherein the plurality of dielectric layers comprises at least one low-k dielectric layer over the front side of the substrate, and a first non-low-k dielectric layer on the at least one low-k dielectric layer.

6. The device of claim 5 further comprising:
a second non-low-k dielectric layer over the first non-low-k dielectric layer.

7. The device of claim 1 further comprising:
an image sensor disposed on the front side of the substrate.

8. The device of claim 1 further comprising:
a buffer layer overlying the STI region and the backside of the substrate.

9. The device of claim 8, wherein the buffer layer is between the passivation layer and the metal shield.

10. The device of claim 8, wherein the buffer layer directly adjoins a sidewall of the substrate.

11. A device comprising:
a substrate comprising a front side and a backside;
a metal shield on the backside of the substrate;
a buffer layer over the metal shield and the backside of the substrate;
a plurality of dielectric layers on the front side of the substrate;
a metal pad on the plurality of dielectric layers;
an opening extending from the backside of the substrate to penetrate through the substrate, the buffer layer, and the plurality of dielectric layers, the opening exposing a surface of the metal pad; and
a passivation layer on a sidewall and a bottom of the opening, the passivation layer at the bottom of the opening partially covering the exposed surface of the metal pad, the passivation layer extending over the buffer layer and the metal shield.

12. The device of claim 11, wherein the passivation layer directly adjoins the buffer layer, each of the plurality of dielectric layers, and the metal pad.

13. The device of claim 11 further comprising:
a bump in the opening, the bump being electrically coupled to the metal pad, the bump directly adjoining the passivation layer.

14. The device of claim 11 further comprising:
a dielectric pad on the front side of the substrate, the opening extending through the dielectric pad.

15. The device of claim 14, wherein the passivation layer directly adjoins the buffer layer, the dielectric pad, each of the plurality of dielectric layers, and the metal pad.

16. The device of claim 11 further comprising:
a glue layer between the metal pad and the plurality of dielectric layers, the opening extending through the glue layer.

17. A structure comprising:
a metal pad;
a first dielectric layer over the metal pad;
an interconnect structure over the first dielectric layer, the interconnect structure comprising a plurality of dielectric layers with metal lines and vias therein;
a substrate over the interconnect structure, a first surface of the substrate being proximate the interconnect structure, a second surface of the substrate being distal the interconnect structure, the second surface being opposite the first surface;
a first buffer layer over the second surface of the substrate;
a second buffer layer over the first buffer layer, the second buffer layer contacting a sidewall of the substrate;
an opening extending through the second buffer layer, the interconnect structure, and the first dielectric layer to expose a portion of the metal pad; and
a passivation layer over and contacting the second buffer layer, lining the opening, and contacting the exposed portion of the metal pad.

18. The structure of claim 17 further comprising:
a glue layer between the metal pad and the first dielectric layer, the opening extending through the glue layer.

19. The structure of claim 17 further comprising:
a bump in the opening, the bump being electrically coupled to the metal pad, the bump contacting the passivation layer.

20. The structure of claim 17 further comprising:
a metal shield over the first buffer layer, the second buffer layer being over the metal shield.

* * * * *